United States Patent
Umuroglu et al.

(10) Patent No.: US 10,089,577 B2
(45) Date of Patent: Oct. 2, 2018

(54) BINARY NEURAL NETWORKS ON PROGAMMABLE INTEGRATED CIRCUITS

(71) Applicant: Xilinx, Inc., San Jose, CA (US)

(72) Inventors: Yaman Umuroglu, Dublin (IE); Michaela Blott, Malahide (IE)

(73) Assignee: XILINX, INC., San Jose, CA (US)

( * ) Notice: Subject to any disclaimer, the term of this patent is extended or adjusted under 35 U.S.C. 154(b) by 54 days.

(21) Appl. No.: 15/230,164

(22) Filed: Aug. 5, 2016

(65) Prior Publication Data

US 2018/0039886 A1   Feb. 8, 2018

(51) Int. Cl.
*G06N 3/08* (2006.01)
*G06N 3/04* (2006.01)

(52) U.S. Cl.
CPC ............... *G06N 3/08* (2013.01); *G06N 3/04* (2013.01)

(58) Field of Classification Search
CPC .................................. G06N 3/08; G06N 3/04
USPC ............................................................ 706/25
See application file for complete search history.

(56) References Cited

U.S. PATENT DOCUMENTS

| | | | |
|---|---|---|---|
| 5,161,203 A * | 11/1992 | Buckley | G06K 9/66 382/157 |
| 5,553,196 A * | 9/1996 | Takatori | G06K 9/48 706/20 |
| 5,892,962 A | 4/1999 | Cloutier | |
| 8,103,606 B2 | 1/2012 | Moussa et al. | |
| 2005/0049984 A1 | 3/2005 | King | |

OTHER PUBLICATIONS

Umuroglu, Yaman et al., "FINN: A Framework for Fast, Scalable Binarized Neural Network Inference," Proc. of the ACM/SIGDA 25th International Symposium on Field—Programmable Gate Arrays, Feb. 22, 2017, pp. 65-74, ACM, New York, New York, USA.
Venieris, Stylianos et al., "fpgaConvNet: A Framework for Mapping Convolutional Neural Networks on FPGAs," Proc. of the 2016 IEEE Annual International Symposium on Field—Programmable Custom Computing Machines, May 1, 2016, pp. 40-47, IEEE, Piscataway, New Jersey, USA.

(Continued)

*Primary Examiner* — Huan Hoang
(74) *Attorney, Agent, or Firm* — Robert M. Brush

(57) ABSTRACT

In an example, a circuit of a neural network implemented in an integrated circuit (IC) includes a layer of hardware neurons, the layer including a plurality of inputs, a plurality of outputs, a plurality of weights, and a plurality of threshold values, each of the hardware neurons including: a logic circuit having inputs that receive first logic signals from at least a portion of the plurality of inputs and outputs that supply second logic signals corresponding to an exclusive NOR (XNOR) of the first logic signals and at least a portion of the plurality of weights; a counter circuit having inputs that receive the second logic signals and an output that supplies a count signal indicative of the number of the second logic signals having a predefined logic state; and a compare circuit having an input that receives the count signal and an output that supplies a logic signal having a logic state indicative of a comparison between the count signal and a threshold value of the plurality of threshold values; wherein the logic signal output by the compare circuit of each of the hardware neurons is provided as a respective one of the plurality of outputs.

20 Claims, 6 Drawing Sheets

(56) References Cited

OTHER PUBLICATIONS

Courbariaux, Matthieu et al., "Binarized Neural Networks: Training Neural Networks with Weights and Activations Constrained to +1 or −1," arXiv.org, Feb. 9, 2016, pp. 1-11, Cornell University Library, <http://arxiv.org/abs/1602.02830>.

Kim, Minje et al., "Bitwise Neural Networks," Proc. of the International Conference of Machine Learning Workshop on Resource Efficient Machine Learning, Jul. 6, 2015, pp. 1-5.

Altera, "Efficient Implementation of Neural Network Systems Built on FPGAs, Programmed with OpenCL," 2015, pp. 1-2, Altera Corp., San Jose, California, USA.

Auviz Systems, "AuvizDNN," downloaded Jun. 20, 2016, pp. 1-2, <http://auvizsystems.com/products/auvizdnn/>, Auviz Systems, Campbell, California, USA.

Beiu, Valerie, "Digital Integrated Circuit Implementation," Handbook of Neural Computaton, Jan. 1, 1997, vol. 4, Chapter E1, 34 pp., IOP Publishing Ltd., Bristol, U.K. and Oxford University Press, Oxford, U.K.

Dally, William, "High-Performance Hardware for Machine Learning," Cadence ENN Summit, Feb. 9, 2016, pp. 1-53.

Gick, S. et al., "Automatic Synthesis of Neural Networks to Programmable Hardware," Proc. of the 3rd International Conference on Microelectronics, 1993. 1 pp.

Girau, Bernard, "Neural Networks on FPGAs: A Survey," Proc. of the 2nd Symposium on Neural Computation, Jan. 2000, pp. 1-7.

Multicoreware, "Machine Learning—Convolutional Neural Networks," downloaded Jun. 20, 2016, pp. 1-4, Multicoreware, Inc., Sunnyvale, California, USA.

Nvidia, "GPU-Based Deep Learning Inference: A Performance and Power Analysis," Nov. 2015, pp. 1-12, Nvidia, Santa Clara, California, USA.

Ovtcharov, Kalin et al., "Accelerating Deep Convolutional Neural Networks Using Specialized Hardware," Feb. 23, 2015, pp. 1-4, Microsoft Research, <https://www.microsoft.com/en-us/research/publication/accelerating-deep-convolutional-neural-networks-using-specialized-hardware/>.

Rastegari, Mohammad et al., "XNOR-Net: ImageNet Classificaton Using Binary Convolutional Neural Networks," arXiv, May 2016, pp. 1-17, Cornell University Library, <http://arxiv.org/abs/1603.05279>.

TERADEEP, "TERADEEP . . . Accelerates Deep Learning," downloaded Jun. 20, 2016, pp. 1-4, TERADEEP Engineering, Santa Clara, California, USA.

\* cited by examiner

BINARY NEURAL NETWORKS ON PROGAMMABLE INTEGRATED CIRCUITS

TECHNICAL FIELD

Examples of the present disclosure generally relate to electronic circuits and, in particular, to binary neural networks on programmable integrated circuits (ICs).

BACKGROUND

There is renewed interest in using programmable integrated circuits (ICs), such as field programmable gate arrays (FPGAs), for deploying neural networks. Present FPGA implementations of neural networks focus on floating point or fixed-point multiply-accumulate typically based on a systolic array architecture. Recently, it has been demonstrated that even large and modern machine learning problems can be solved with neural networks using binary representations for weights and activations while achieving high accuracy. However, implementations of binary neural networks have heretofore been constrained to software.

SUMMARY

Techniques for implementing binary neural networks on programmable integrated circuits (ICs) are described. In an example, a circuit of a neural network implemented in an integrated circuit (IC) includes a layer of hardware neurons, the layer including a plurality of inputs, a plurality of outputs, a plurality of weights, and a plurality of threshold values, each of the hardware neurons including: a logic circuit having inputs that receive first logic signals from at least a portion of the plurality of inputs and outputs that supply second logic signals corresponding to an exclusive NOR (XNOR) of the first logic signals and at least a portion of the plurality of weights; a counter circuit having inputs that receive the second logic signals and an output that supplies a count signal indicative of the number of the second logic signals having a predefined logic state; and a compare circuit having an input that receives the count signal and an output that supplies a logic signal having a logic state indicative of a comparison between the count signal and a threshold value of the plurality of threshold values; wherein the logic signal output by the compare circuit of each of the hardware neurons is provided as a respective one of the plurality of outputs.

In another example, a method of implementing a neural network in an integrated circuit (IC) includes implementing a layer of hardware neurons in the IC, the layer including a plurality of inputs, a plurality of outputs, a plurality of weights, and a plurality of threshold values; and at each of the plurality of neurons: receiving first logic signals from at least a portion of the plurality of inputs and supplying second logic signals corresponding to an exclusive NOR (XNOR) of the first logic signals and at least a portion of the plurality of weights; receiving the second logic signals and supplying a count signal indicative of the number of the second logic signals having a predefined logic state; and receiving the count signal and supplying a logic signal having a logic state indicative of a comparison between the count signal and a threshold value of the plurality of threshold values.

In another example, a programmable integrated circuit (IC) includes a programmable fabric configured to implement: a layer of hardware neurons, the layer including a plurality of inputs, a plurality of outputs, a plurality of weights, and a plurality of threshold values. Each of the hardware neurons includes a logic circuit having inputs that receive first logic signals from at least a portion of the plurality of inputs and outputs that supply second logic signals corresponding to an exclusive NOR (XNOR) of the first logic signals and at least a portion of the plurality of weights; a counter circuit having inputs that receive the second logic signals and an output that supplies a count signal indicative of the number of the second logic signals having a predefined logic state; and a compare circuit having an input that receives the count signal and an output that supplies a logic signal having a logic state indicative of a comparison between the count signal and a threshold value of the plurality of threshold values. The logic signal output by the compare circuit of each of the hardware neurons is provided as a respective one of the plurality of outputs.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
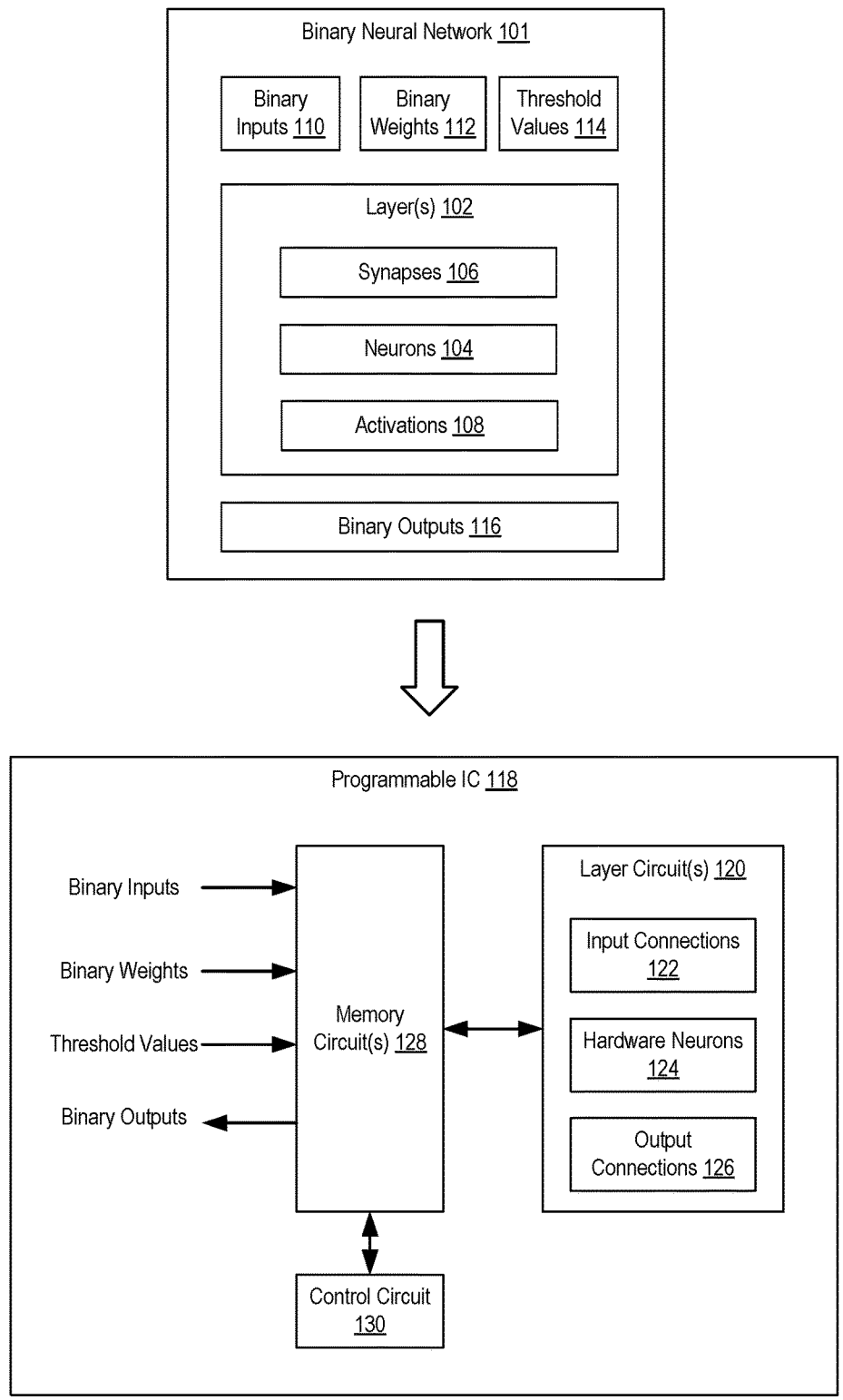
FIG. 1 is a block diagram depicting a mapping of a binary neural network onto a hardware implementation in a programmable integrated circuit (IC) according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

The present disclosure describes a highly efficient hardware implementation of a binary neural network. In an example, the hardware implementation is mapped to the architecture of a programmable integrated circuit (IC), such as a field programmable gate array (FPGA). The implementation maps a large number of neurons that process input data with a high compute intensity. For example, assuming a full neural network can be unrolled completely inside an FPGA, then the neural network can classify incoming data sets (e.g., images) at clock frequency. Assuming a conservative clock frequency of 100 MHz, such a neural network implementation can classify input data sets at 100 million data sets per second (e.g., images per second). In other examples, a certain amount of folding is performed to implement the neural network. The hardware implementation of a neural network described herein is fundamentally different than previous implementations in FPGAs that map floating point neural networks onto systolic arrays of generic processing engines. Such floating point implementations currently process 100-300 data sets per second. Furthermore, the neural network implementation described herein consumes less power than previous floating point implementations in FPGAs and over implementations using graphics processing units (GPUs).

The benefit of binary neural networks is that standard floating point multiply accumulate operations become exclusive NOR and bit count operations, as described further herein. The basic architecture includes a number of layers, which can be fully-connected or partially connected (e.g., convolutional, pooling, etc.). Each layer includes a number of hardware neurons. Each hardware neuron computes a neuron as an XNOR of all data inputs and corresponding weights, counts the number of logic "1" bits in the result, and compares the count to a threshold. The hardware neuron returns true (logic "1") when the bit count is larger than the threshold and false (logic "0") otherwise. The fully-connected and partially-connected layers differ in how the hardware neurons receive the input data. For fully-connected layers, the input is broadcast to all hardware neurons. For partially-connected layers, each hardware neuron operates on a portion of the input data. For example, in a convolutional layer, each hardware neuron operates on a sequence of portions of the input data to generate a corresponding sequence of activations. Depending on the implementation, pooling layers (e.g., max pooling layers) can be used to down-sample a previous layer's output.

In some implementations, weights and thresholds may be infrequently updated (e.g., only after networks have been retrained). Thus, the weights and/or thresholds can be "hardened" to generate specialized hardware neurons. Specialization of the network should remove all resource requirements associated with XNOR operations and/or compare operations. Furthermore, when implemented in an FPGA, specializing the network can consume significantly less routing resources than a non-specialized network implementation.

In some implementations, large networks may not be capable of fully unrolled implementation due to resource constraints. For example, routing limitations in an FPGA can prevent efficient implementation of a large, fully-connected layer having a large number of synapses. Thus, in some examples, the network can be folded onto the hardware architecture. Folding can be achieved with varying granularity. On a macro-level, entire layers can be iteratively folded onto the architecture. Alternatively, some neurons can be folded onto the same hardware neuron, and some synapses can be folded onto the same connections (reducing the routing requirements). These and further aspects of the binary neural network implementation are described below with reference to the drawings.

FIG. 1 is a block diagram depicting a mapping of a binary neural network 101 onto a hardware implementation in a programmable integrated circuit (IC) according to an example. The binary neural network includes one or more layers 102. Each layer 102 includes neurons 104 having synapses 106 (e.g., inputs) and activations 108 (e.g., outputs). Inputs to the layer(s) 102 include binary inputs 110, binary weights 112, and threshold values 114. Outputs of the layer(s) 102 include binary outputs 116. Each binary input 110 is a 1-bit value (e.g., a logic "0" or a logic "1"). Likewise, each binary weight 112 is a 1-bit value. Each threshold value 114 is an integer. Each binary output 116 is a 1-bit value. Each neuron 104 receives one or more binary inputs 110 through a respective one or more synapses 106. Each neuron 104 also receives one or more binary weights 112 for synapses 106 and a threshold value 114. Each neuron 104 supplies binary output 116 through an activation 108. A neuron 104 is "activated" when its binary input(s), binary weight(s), and threshold value cause its binary output to be asserted (e.g., a logic "1").

Figure 2:
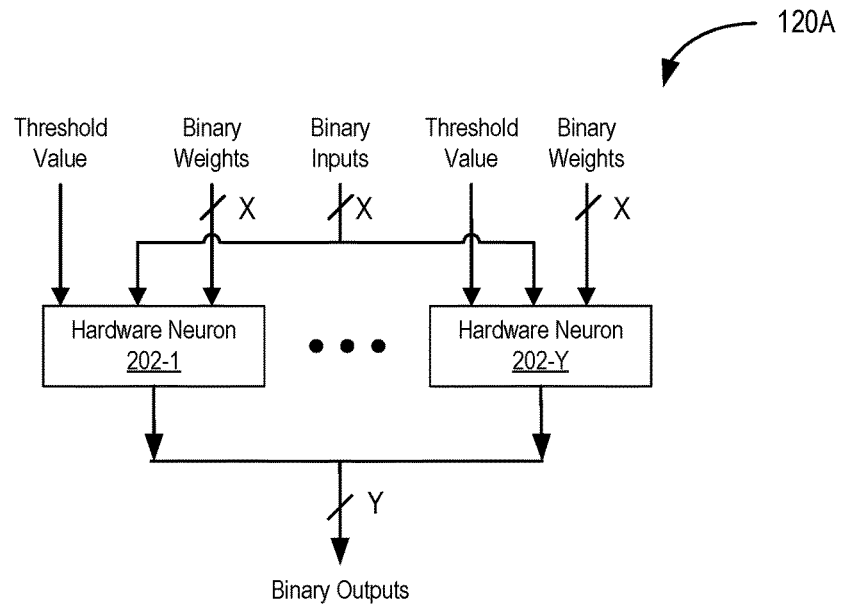
FIG. 2 is a block diagram depicting a layer circuit of a neural network circuit according to an example.

Some layers 102 can be "fully-connected," as shown in FIG. 2 for example. In a fully-connected layer, a given set of binary inputs 110 or given set of activations 108 from a previous layer is broadcast to all neurons 104. That is, each neuron 104 operates on the same set of inputs. Some layers 102 can be "partially-connected." In a partially-connected layer, each neuron 104 operates on a portion of a given set of binary inputs 110 or a given set of activations 108 from a previous layer. Different neurons 104 can operate on the same or different portions of inputs set. The binary inputs 110 can represent one or more data sets, such as one or more images. In the image example, the input to a fully-connected layer is an entire image, and the input to a partially-connected layer is a portion of an image. Some layers 102 can be "convolutional" layers. In a convolutional layer, each neuron 104 operates on a sequence of portions of a given set of binary inputs 110 or a given set of activations 108 from a previous layer.

In the example, the binary neural network 101 is mapped to hardware in a programmable IC 118. An example programmable IC is a field programmable gate array (FPGA). An example architecture of an FPGA is described below. While the binary neural network 101 is described as being mapped to hardware in a programmable IC, it is to be understood that the binary neural network 101 can be mapped to hardware in any type of IC (e.g., an application specific integrated circuit (ASIC)).

The hardware implementation of the binary neural network 101 includes layer circuits 120. Each layer circuit 120 includes input connections 122, hardware neurons 124, and output connections 126. The layer(s) 102 are mapped to the layer circuit(s) 120. The synapses 106 are mapped to the input connections 122. The neurons 104 are mapped to the hardware neurons 124. The activations 108 are mapped to the output connections 126. The layer circuit(s) 120 can be generated using a circuit design tool executing on a computer system based on specifications describing the layer(s) 102. The circuit design tool can generate configuration data for configuring the layer circuit(s) 120 in the programmable IC 118. Alternatively, for a non-programmable IC (e.g., ASIC), the circuit design tool can generate mask-data for manufacturing an IC having the layer circuit(s) 120.

Figure 3:
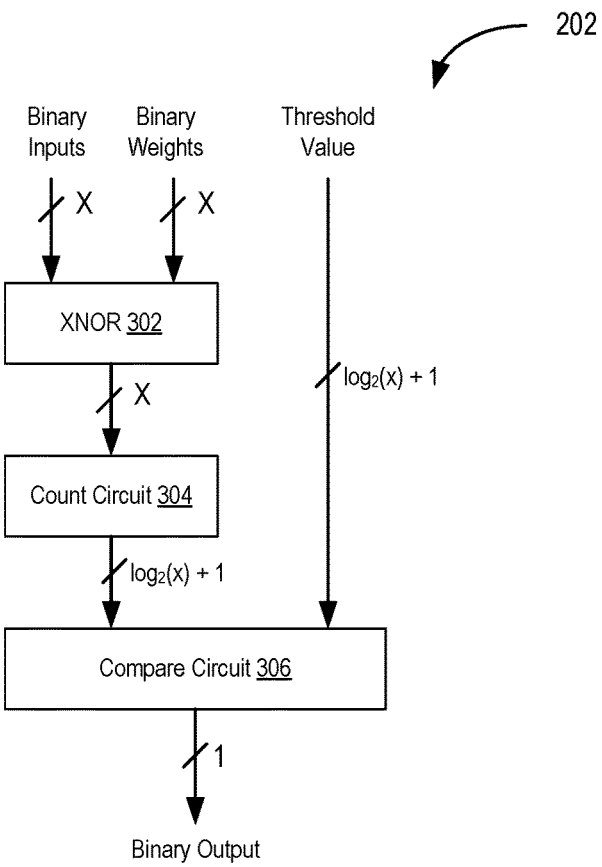
FIG. 3 is a block diagram depicting a hardware neuron according to an example.
Figure 5:
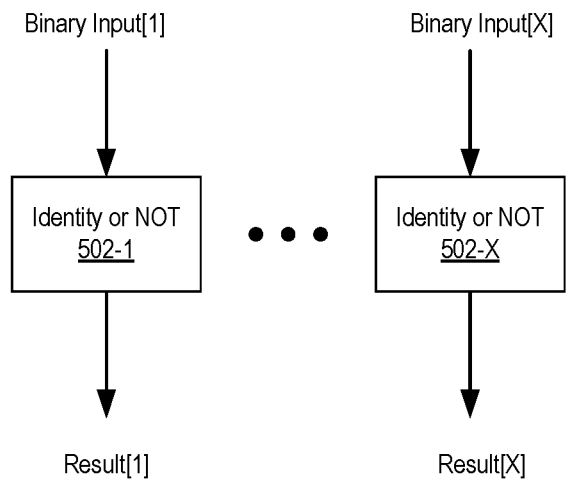
FIG. 5 is a block diagram showing specialization of a hardware neuron according to an example.

The programmable IC 118, as shown in FIG. 3 for example, includes circuits to facilitate operation of the layer circuit(s) 120, including memory circuit(s) 128 and a control circuit 130. Memory circuit(s) 128 can store binary inputs, binary weights, threshold values, and binary outputs for the layer circuit(s) 120. Memory circuit(s) 128 can include registers, first-in-first-out (FIFO) circuits, and the like. Control circuit 130 can control writing to and reading from the memory circuit(s) 128. In other examples, binary inputs can directly come from external circuits, and outputs can be directly transmitted to external circuits. Weights and thresholds may be hard-coded as part of the logic when specializing layers as shown in FIG. 5. Memory circuit(s) 128 may be on-chip or off-chip.

FIG. 2 is a block diagram depicting a layer circuit 120A of a neural network circuit according to an example. The layer circuit 120A is an example of a fully connected layer and can be used as any of the layer circuits 120 shown in FIG. 1. The layer circuit 120A includes hardware neurons 202-1 through 202-Y (generally referred to as a hardware neuron 202 or hardware neurons 202), where Y is a positive integer. Data inputs of each of the hardware neurons 202 (e.g., the synapses) receive logic signals supplying binary inputs. The binary inputs can be a set of the binary inputs 110 or a set of activations from a previous layer. In the example, each hardware neuron 202 includes X data inputs (e.g., X synapses) for receiving X logic signals, where X is a positive integer. Each of the X logic signals provides a single binary input.

Each of the hardware neurons 202 includes weight inputs receiving logic signals supplying binary weights. Each neuron 202 can receive the same or a different set of binary weights. Each hardware neuron 202 receives X binary weights corresponding to the X data inputs. Each hardware neuron 202 also receives a threshold value, which can be the same or different from other hardware neurons 202. Each of the hardware neurons 202 generates a logic signal as output (e.g., a 1-bit output). The hardware neurons 202-1 through 202-Y collectively output Y logic signals providing Y binary outputs (e.g., Y activations).

FIG. 3 is a block diagram depicting a hardware neuron 202 according to an example. The hardware neuron 202 includes an exclusive NOR (XNOR) circuit 302, a count circuit 304, and a compare circuit 306. The XNOR circuit 302 receives X logic signals supplying the binary inputs and X logic signals supplying the binary weights. The XNOR circuit 302 outputs X logic signals supplying respective XNOR results of the binary inputs and the binary weights. The count circuit 304 is configured to count the number of the X logic signals output by the XNOR circuit 302 that have a predefined logic state (e.g., the number of logic "1's" output by the XNOR circuit 302). The count circuit 304 outputs a count signal supplying a count value. The number of bits of the count signal is $\log_2(X)+1$. For example, if X is 256, then the count signal includes nine bits. The compare circuit 306 receives the count signal and a threshold signal supplying a threshold value. The threshold signal has the same width as the count signal (e.g., $\log_2(X)+1$). The compare circuit 306 outputs a logic signal supplying a 1-bit output value. The compare circuit 306 asserts the output logic signal (e.g., sets it to logic "1") when the count value is larger than the threshold value and de-asserts the output logic signal otherwise (e.g., sets it to logic "0").

Each hardware neuron of a layer operates the same regardless of the type of layer. As shown in FIG. 3, each hardware neuron computes an XNOR between the binary inputs and the binary weights using XNOR circuit 302. The count circuit 304 counts the number of predefined logic states in the results of the XNOR operation (e.g., the number of logic "1s"). The compare circuit 306 compares the count value with the threshold value and asserts or de-asserts its output accordingly.

Figure 4:
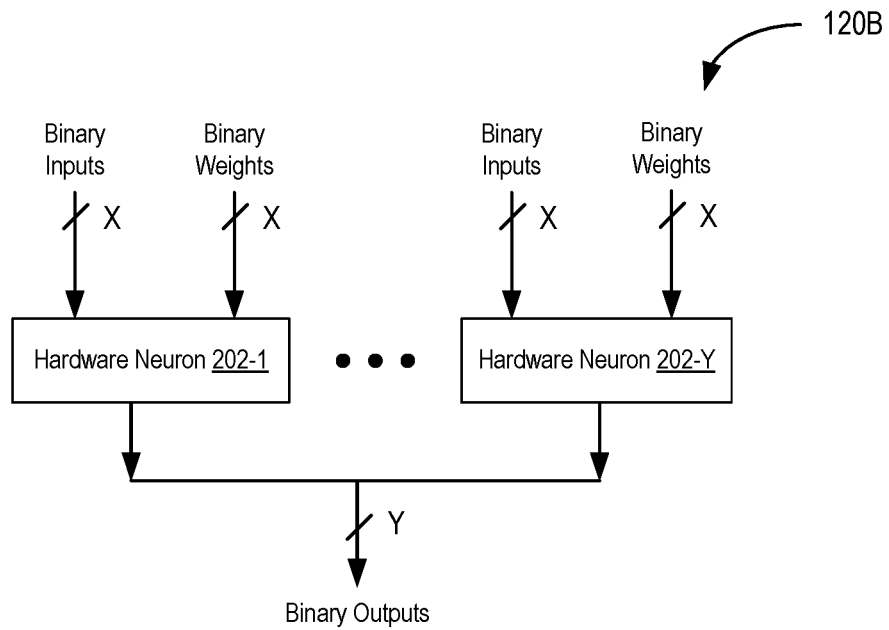
FIG. 4 is a block diagram depicting a layer circuit of a neural network circuit according to an example.

FIG. 4 is a block diagram depicting a layer circuit 120B of a neural network circuit according to an example. The layer circuit 120B is an example of a partially connected layer or convolutional layer and can be used as any of the layers 120 shown in FIG. 1. The example of FIG. 4 differs from that of FIG. 3 in that each of the hardware neurons 202 receives an individual set of binary inputs (i.e., the binary inputs are not broadcast to all of the hardware neurons 202). Each set of binary inputs can be a portion of a set of the binary inputs 110 or a portion of the set of activations from a previous layer. The threshold value input for each hardware neuron 202 is omitted from FIG. 4 for clarity. The hardware neurons 202 shown in FIG. 4 have the same structure as shown in FIG. 3.

For example, the layer circuit 120B can be used as a convolutional layer. In such an example, an input data set (e.g., an image) can be divided into a set of N input feature maps each having a height H and a width W. The corresponding binary weights can be divided into N*M sets each having K*K binary weight values. In such an example, the value X can be set to K*K and the value Y can be set to M*W*H. A sequence of binary input sets is provided to each of the hardware neurons 202 to implement a sequence of convolutions. The sequencing can be controlled by the control circuit 130 through control of the memory circuit(s) 128.

FIG. 5 is a block diagram showing specialization of a hardware neuron according to an example. In an example, the XNOR circuit 302 includes an XNOR gate for each of the X data inputs. The ith XNOR gate outputs a result[i] =input[i] XNOR weight[i]. In another example, the XNOR circuit 302 can be specialized by hardening the weights. Rather than having variable weights, the weights can be fixed and the XNOR gates reduced to either an identity gate (e.g., a pass through gate) or a NOT gate (e.g., an inverter) depending on the fixed state of the respective weight value. As shown in FIG. 5, the XNOR circuit 302 can include circuits 502-1 through 502-X each receiving a logic signal supplying a data input value. Each circuit 502 is either an identity gate or a NOT gate depending the respective weight value. For example, if the ith weight is logic "1", then the ith circuit 502-i is a NOT gate (e.g., when data input[i] is logic "1" then result[i] is logic "0" and vice versa to implement the XNOR function with weight[i]=logic "1"). If the ith weight is logic "0", then the ith circuit 502-i is an identity gate (e.g., when data input[i] is logic "1" then result[i] is logic "1" and vice versa to implement the XNOR function with weight[i]=logic "0"). Such a specialization of the hardware neuron can be implemented when the weight values are known a-priori.

In examples, the binary neural network 101 is implemented using the layer circuit(s) 120 without folding (e.g., "unfolded"). In the folded case, each layer 102 of the binary neural network 101 is implemented using a corresponding layer circuit 120 in the programmable IC 118. In other examples, the binary neural network 101 is implemented using some type of folding.

Figure 6:
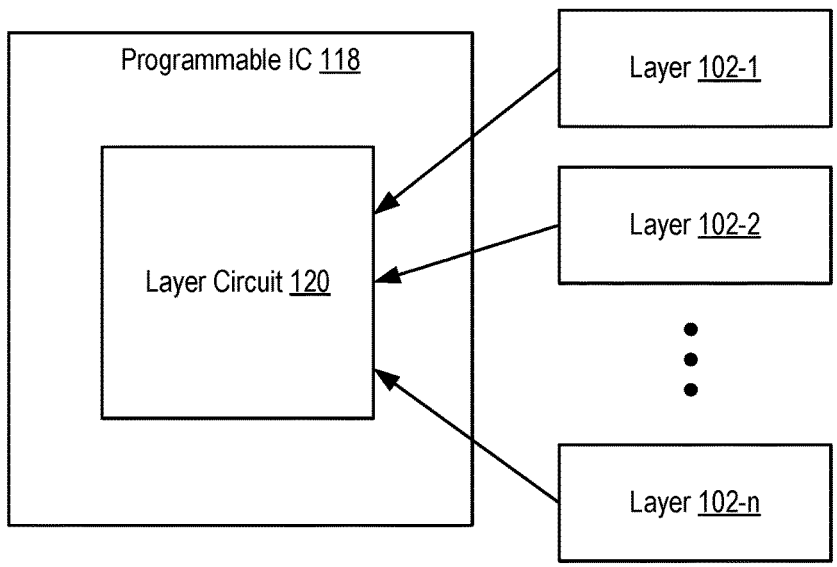
FIG. 6 is a block diagram depicting an example of folding the layers of the binary neural network on a macro-level (referred to as "macro-level folding").

FIG. 6 is a block diagram depicting an example of folding the layers 102 of the binary neural network 101 on a macro-level (referred to as "macro-level folding"). In the example shown, the programmable IC 118 includes a single layer circuit 120 and the binary neural network 101 includes n layers 102-1 through 102-n, where n is an integer greater than one. The layers 102-1 through 102-n are time-multiplexed onto the layer circuit 120. That is, the layer circuit 120 is configured to implement the layer 102-1, then the layer 102-2, and so on until implementing the layer 102-n. The results generated by the layer circuit 120 are saved to be used as input to the next implementation of a layer 102. In other examples, the programmable IC 118 can include more than one layer circuit 120 and the layers 102 are folded across multiple layer circuits 120.

Figure 7:
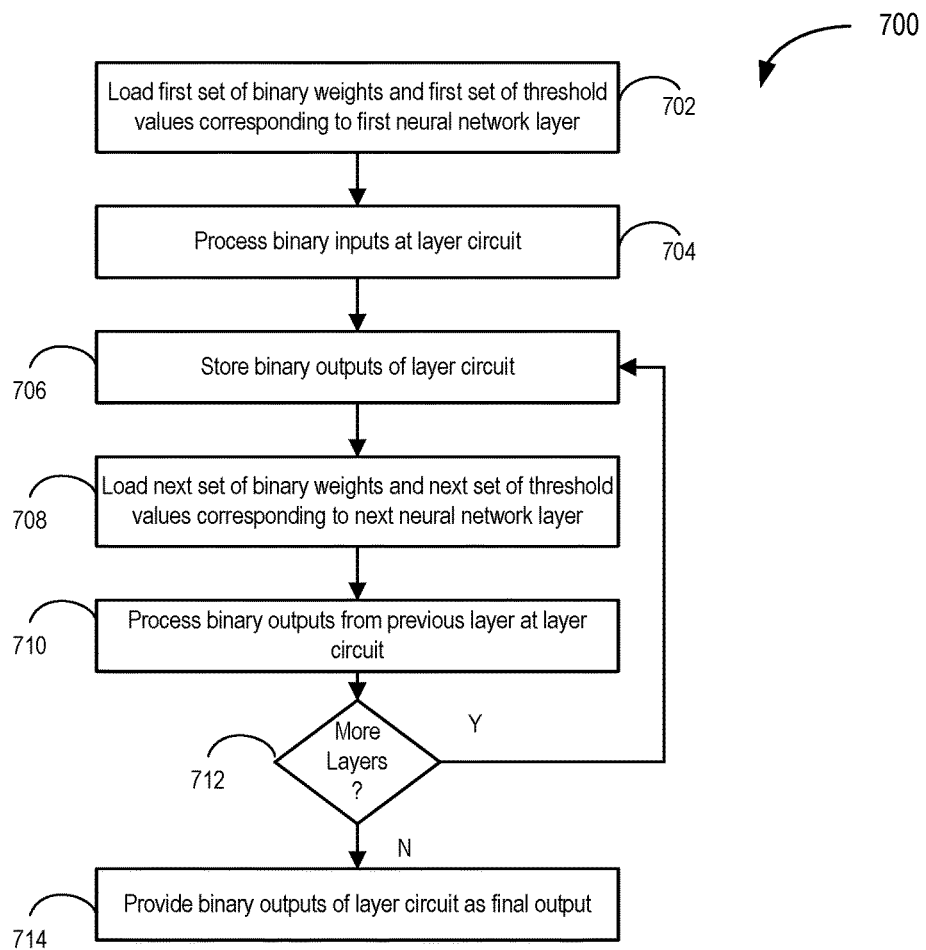
FIG. 7 is a flow diagram depicting a method of macro-level folding according to an example.

FIG. 7 is a flow diagram depicting a method 700 of macro-level folding according to an example. The method 700 can be implemented using the programmable IC 118 as shown in FIG. 1. The method 700 begins at step 702, where the control circuit 130 loads a first set of binary weights and a first set of threshold values corresponding to a first layer of the binary neural network 101 into the memory circuit(s) 128 for use by the layer circuit(s) 120. At step 704, the layer circuit(s) 120 process the binary inputs thereto. At step 706, the control circuit 130 stores the outputs of the layer circuit(s) 120 in the memory circuit(s) 128. At step 708, the control circuit 130 loads a next set of binary weights and a next set of threshold values corresponding to a next layer of the binary neural network 101 into the memory circuit(s) 120 for use by the layer circuit(s) 120. At step 710, the layer circuit(s) 120 process the binary outputs produced by the layer circuit(s) 120 for the previous layer. At step 712, the control circuit 130 determines whether there are more layers 102 of the binary neural network 101 to be implemented. If so, the method 700 returns to step 706 and repeats. Otherwise, the method 700 proceeds to step 714, where the binary outputs of the layer circuit(s) 120 are provided as the final outputs.

Figure 8:
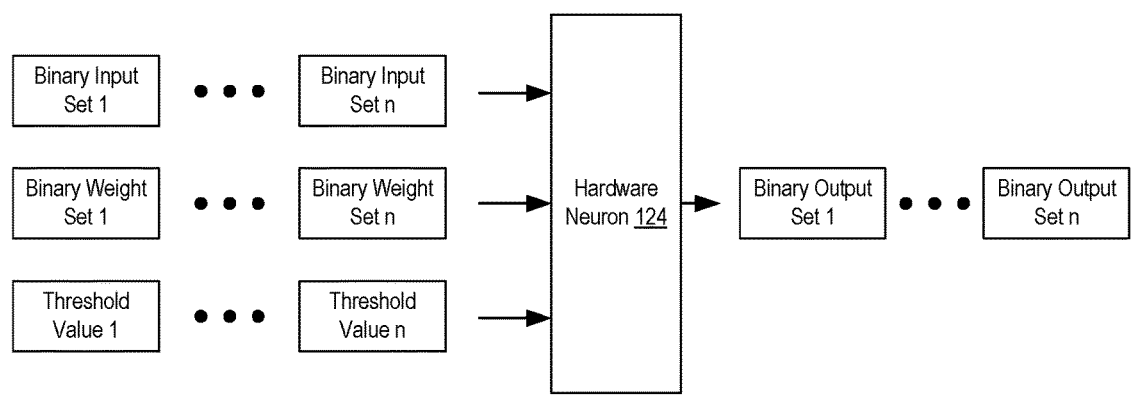
FIG. 8 is a block diagram depicting an example of folding neurons of the binary neural network on a micro-level (referred to as "micro-level folding").

FIG. 8 is a block diagram depicting an example of folding neurons 104 of the binary neural network 101 on a micro-level (referred to as "micro-level folding"). In the example shown, multiple sets of binary inputs, binary weights, and threshold values are provided as input to a hardware neuron 124 (e.g., n sets of inputs). That is, n neurons 104 are folded onto the hardware neuron 124. Each of the n neurons is represented by a given set of binary inputs, binary weights, and threshold values. The hardware neuron 124 generates a binary output set for each set of inputs (e.g., n binary output sets for the n input sets).

Figure 9:
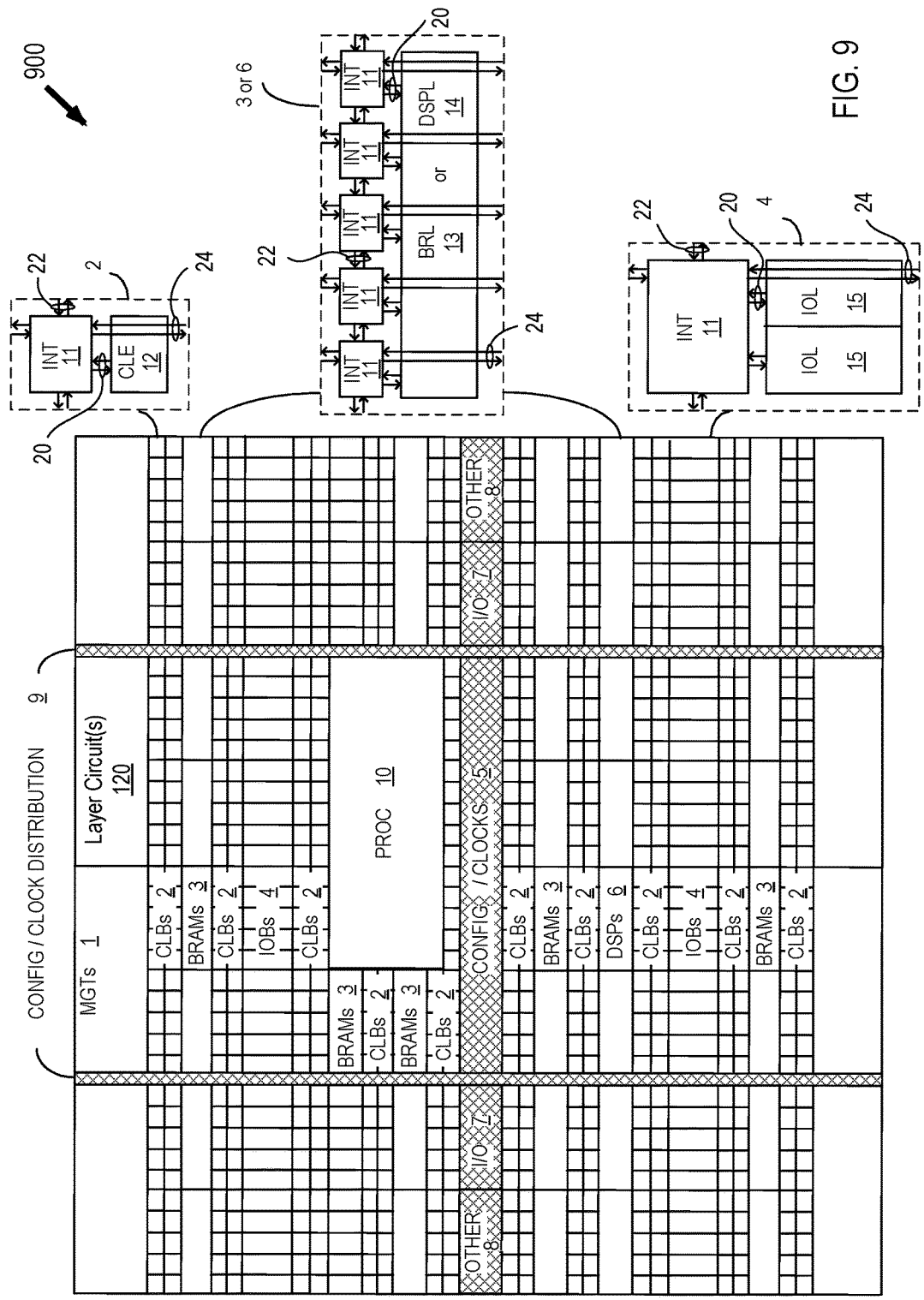
FIG. 9 illustrates an architecture of a field programmable gate array (FPGA) having hardware layers of a neural network implementation according to an example.

FIG. 9 illustrates an architecture of an FPGA 900 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. The FPGA 900 can be used as the programmable IC 118 shown in FIG. 1. In such case, the layer circuit(s) 120 are implemented using the programmable fabric of the FPGA 900.

In some FPGAs, each programmable tile can include at least one programmable interconnect element ("INT") 11 having connections to input and output terminals 20 of a programmable logic element within the same tile, as shown by examples included at the top of FIG. 11. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An IOB 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 11) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 9 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 9 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A circuit of a neural network implemented in an integrated circuit (IC), comprising:
   a layer of hardware neurons, the layer including a plurality of inputs, a plurality of outputs, a plurality of weights, and a plurality of threshold values, each of the hardware neurons including:
      a logic circuit having inputs that receive first logic signals from at least a portion of the plurality of inputs and outputs that supply second logic signals corresponding to an exclusive NOR (XNOR) of the first logic signals and at least a portion of the plurality of weights;
      a counter circuit having inputs that receive the second logic signals and an output that supplies a count signal indicative of the number of the second logic signals having a predefined logic state; and
      a compare circuit having an input that receives the count signal and an output that supplies a logic signal having a logic state indicative of a comparison between the count signal and a threshold value of the plurality of threshold values;
   wherein the logic signal output by the compare circuit of each of the hardware neurons is provided as a respective one of the plurality of outputs.

2. The circuit of claim 1, wherein the first logic signals input to the logic circuit of each of the hardware neurons is the plurality of inputs to the layer.

3. The circuit of claim 1, wherein the layer is configured to receive a plurality of weight signals supplying the plurality of weights, and wherein the logic circuit in each of the hardware neurons is an XNOR circuit.

4. The circuit of claim 1, wherein the logic circuit in at least a portion of the hardware neurons is either a pass circuit or an inverter based on a fixed value for each of the plurality of weights.

5. The circuit of claim 1, wherein the neural network comprises a plurality of layers, and wherein the circuit further comprises:
   a control circuit configured to map each of the plurality of layers to the layer of hardware neurons in sequence over time.

6. The circuit of claim 1, further comprising:
   a control circuit configured to supply each of a plurality of sets of input data to the plurality of inputs of the layer in sequence over time.

7. The circuit of claim 1, further comprising:
   a control circuit configured to supply each of a plurality of sets of weights as the plurality of weights of the layer in sequence over time.

8. The circuit of claim 1, wherein the layer of hardware neurons is a first layer of hardware neurons, wherein the plurality of inputs, the plurality of outputs, the plurality of weights, and the plurality of threshold values are a first plurality of inputs, a first plurality of outputs, a first plurality of weights, and a first plurality of threshold values, respectively, and wherein the circuit further comprises:
   a second layer of hardware neurons, the second layer including a second plurality of inputs, a second plurality of outputs, a second plurality of weights, and a second plurality of threshold values;
   wherein the second plurality of inputs of the second layer is the first plurality of outputs of the first layer.

9. The circuit of claim 8, further comprising:
   memory circuitry disposed between the first plurality of outputs of the first layer and the second plurality of inputs of the second layer.

10. A method of implementing a neural network in an integrated circuit (IC), comprising:
    implementing a layer of hardware neurons in the IC, the layer including a plurality of inputs, a plurality of outputs, a plurality of weights, and a plurality of threshold values;
    at each of the plurality of neurons:
    receiving first logic signals from at least a portion of the plurality of inputs and supplying second logic signals corresponding to an exclusive NOR (XNOR) of the first logic signals and at least a portion of the plurality of weights;
    receiving the second logic signals and supplying a count signal indicative of the number of the second logic signals having a predefined logic state; and
    receiving the count signal and supplying a logic signal having a logic state indicative of a comparison between the count signal and a threshold value of the plurality of threshold values.

11. The method of claim 10, wherein the first logic signals input to each of the hardware neurons is the plurality of inputs to the layer.

12. The method of claim 10, wherein the layer is configured to receive a plurality of weight signals supplying the plurality of weights, and wherein each of the hardware neurons includes an XNOR circuit.

13. The method of claim 10, wherein at least a portion of the hardware neurons includes either a pass circuit or an inverter based on a fixed value for each of the plurality of weights.

14. The method of claim 10, wherein the neural network comprises a plurality of layers, and the method further comprises:
    mapping each of the plurality of layers to the layer of hardware neurons in sequence over time.

15. The method of claim 10, further comprising:
    supplying each of a plurality of sets of input data to the plurality of inputs of the layer in sequence over time.

16. The method of claim 10, further comprising:
    supplying each of a plurality of sets of weights as the plurality of weights of the layer in sequence over time.

17. The method of claim 10, wherein the layer of hardware neurons is a first layer of hardware neurons, wherein the plurality of inputs, the plurality of outputs, the plurality of weights, and the plurality of threshold values are a first plurality of inputs, a first plurality of outputs, a first plurality of weights, and a first plurality of threshold values, respectively, and wherein the method further comprises:
    implementing a second layer of hardware neurons, the second layer including a second plurality of inputs, a second plurality of outputs, a second plurality of weights, and a second plurality of threshold values;
    wherein the second plurality of inputs of the second layer is the first plurality of outputs of the first layer.

18. The method of claim 17, further comprising:
    memory circuitry disposed between the first plurality of outputs of the first layer and the second plurality of inputs of the second layer.

19. A programmable integrated circuit (IC), comprising:
    a programmable fabric configured to implement:
    a layer of hardware neurons, the layer including a plurality of inputs, a plurality of outputs, a plurality of weights, and a plurality of threshold values, each of the hardware neurons including:
- a logic circuit having inputs that receive first logic signals from at least a portion of the plurality of inputs and outputs that supply second logic signals corresponding to an exclusive NOR (XNOR) of the first logic signals and at least a portion of the plurality of weights;
- a counter circuit having inputs that receive the second logic signals and an output that supplies a count signal indicative of the number of the second logic signals having a predefined logic state; and
- a compare circuit having an input that receives the count signal and an output that supplies a logic signal having a logic state indicative of a comparison between the count signal and a threshold value of the plurality of threshold values;

wherein the logic signal output by the compare circuit of each of the hardware neurons is provided as a respective one of the plurality of outputs.

20. The programmable IC of claim 19, wherein the layer is configured to receive a plurality of weight signals supplying the plurality of weights, and wherein the logic circuit in each of the hardware neurons is an XNOR circuit.

* * * * *